United States Patent
Dunn et al.

(10) Patent No.: US 10,185,352 B2
(45) Date of Patent: Jan. 22, 2019

(54) MODULAR SYSTEM FOR CONTROLLING A LIQUID CRYSTAL DISPLAY

(71) Applicant: Manufacturing Resources International, Inc., Alpharetta, GA (US)

(72) Inventors: William Dunn, Alpharetta, GA (US); Jerry Wasinger, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 15/437,334

(22) Filed: Feb. 20, 2017

(65) Prior Publication Data

US 2017/0163928 A1 Jun. 8, 2017

Related U.S. Application Data

(60) Division of application No. 13/045,272, filed on Mar. 10, 2011, now Pat. No. 9,578,273, which is a
(Continued)

(51) Int. Cl.
*G06F 1/16* (2006.01)
*G06F 1/18* (2006.01)
(Continued)

(52) U.S. Cl.
CPC ............ *G06F 1/1601* (2013.01); *G06F 1/181* (2013.01); *H01R 12/7076* (2013.01);
(Continued)

(58) Field of Classification Search
CPC ................ H01R 23/70; H01R 23/7005; H05K 2201/1034
(Continued)

(56) References Cited

U.S. PATENT DOCUMENTS 5,631,805 A  5/1997 Bonsall
5,636,101 A  6/1997 Bonsall et al.
(Continued)

FOREIGN PATENT DOCUMENTS

JP  2000122575 A  4/2000
JP  2006145890 A  6/2006
(Continued)

*Primary Examiner* — Binh Tran
(74) *Attorney, Agent, or Firm* — Standley Law Group LLP

(57) ABSTRACT

A modular electrical system for controlling a liquid crystal display (LCD) contained within a chassis. The system may include a backplane in communication with a power module and video module through connectors on the back plane and respective connectors on the modules. The system may also include a timing and control board (TCON) that is in communication with the backplane via conduction lines that are provided to carry power, video signals, etc., to the TCON. Guides may be provided to ensure proper alignment of the power module and video module with the backplane. In some embodiments, the power module and video module may include input and output connectors that facilitate connection of multiple displays in a daisy chain fashion.

20 Claims, 2 Drawing Sheets

Related U.S. Application Data continuation of application No. 12/684,608, filed on Jan. 8, 2010, now Pat. No. 9,648,270.

(60) Provisional application No. 61/312,538, filed on Mar. 10, 2010, provisional application No. 61/379,193, filed on Sep. 1, 2010, provisional application No. 61/143,189, filed on Jan. 8, 2009.

(51) Int. Cl.
| | | |
|---|---|---|
| *H04N 5/63* | (2006.01) | |
| *H04N 5/64* | (2006.01) | |
| *H01R 12/70* | (2011.01) | |
| *H01R 12/73* | (2011.01) | |
| *H04N 5/655* | (2006.01) | |
| *H05K 1/11* | (2006.01) | |
| *H01R 12/50* | (2011.01) | |
| *H01L 23/31* | (2006.01) | |
| *H01L 23/32* | (2006.01) | |

(52) U.S. Cl.
CPC .............. *H01R 12/73* (2013.01); *H04N 5/63* (2013.01); *H04N 5/64* (2013.01); *H04N 5/655* (2013.01); *H05K 1/117* (2013.01); *G06F 2200/1612* (2013.01); *H01L 23/3107* (2013.01); *H01L 23/32* (2013.01); *H01R 23/70* (2013.01); *H01R 23/7005* (2013.01); *H05K 2201/044* (2013.01); *H05K 2201/0999* (2013.01); *H05K 2201/09754* (2013.01); *H05K 2201/1034* (2013.01)

(58) Field of Classification Search
USPC .... 361/679.32, 679.37, 679.38, 679.39, 727, 361/728, 729, 731, 733, 736, 737, 741, 361/756, 784, 785, 788, 792
See application file for complete search history.

(56) References Cited

U.S. PATENT DOCUMENTS

| | | | |
|---|---|---|---|
| 5,640,302 A * | 6/1997 | Kikinis | G06F 1/1616 361/679.26 |
| 5,729,289 A | 3/1998 | Etoh | |
| 5,786,801 A | 7/1998 | Ichise | |
| 5,809,432 A * | 9/1998 | Yamashita | H04B 1/3816 455/557 |
| 5,952,992 A | 9/1999 | Helms | |
| 6,144,359 A | 11/2000 | Grave | |
| 6,292,157 B1 | 9/2001 | Greene et al. | |
| 6,330,150 B1 | 12/2001 | Kim | |
| 6,639,790 B2 | 10/2003 | Tsai et al. | |
| 6,812,851 B1 | 11/2004 | Dukach et al. | |
| 6,850,209 B2 | 2/2005 | Mankins et al. | |
| 6,937,258 B2 | 8/2005 | Lim et al. | |
| 6,962,528 B2 | 11/2005 | Yokota | |
| 7,064,672 B2 | 6/2006 | Gothard | |
| 7,092,248 B2 | 8/2006 | Shu | |
| 7,230,659 B2 | 6/2007 | Ha et al. | |
| 7,334,361 B2 | 2/2008 | Schrimpf et al. | |
| 7,339,782 B1 | 3/2008 | Landes et al. | |
| 7,513,830 B2 | 4/2009 | Hajder et al. | |
| 7,518,600 B2 | 4/2009 | Lee | |
| 7,589,958 B2 | 9/2009 | Smith | |
| 7,609,506 B2 | 10/2009 | Aguirre | |
| 7,774,633 B1 | 8/2010 | Harrenstien et al. | |
| 8,102,173 B2 | 1/2012 | Merrow | |
| 8,116,081 B2 | 2/2012 | Crick, Jr. | |
| 8,144,110 B2 | 3/2012 | Huang | |
| 8,310,824 B2 | 11/2012 | Dunn et al. | |
| 8,352,758 B2 | 1/2013 | Atkins | |
| 9,072,166 B2 | 6/2015 | Dunn et al. | |
| 9,286,020 B2 | 3/2016 | Dunn et al. | |
| 9,313,447 B2 | 4/2016 | Dunn et al. | |
| 9,451,060 B1 | 9/2016 | Bowers et al. | |
| 9,516,485 B1 | 12/2016 | Bowers et al. | |
| 9,578,273 B2 | 2/2017 | Dunn et al. | |
| 9,622,392 B1 | 4/2017 | Bowers et al. | |
| 9,648,270 B2 | 5/2017 | Williams et al. | |
| 2001/0043290 A1 | 11/2001 | Yamamoto | |
| 2002/0112026 A1 | 8/2002 | Fridman et al. | |
| 2002/0140651 A1 | 10/2002 | Lim et al. | |
| 2002/0164962 A1 | 11/2002 | Mankins et al. | |
| 2002/0186333 A1 | 12/2002 | Ha et al. | |
| 2003/0039094 A1 | 2/2003 | Sarkinen et al. | |
| 2003/0204342 A1 | 10/2003 | Law et al. | |
| 2004/0036697 A1 | 2/2004 | Kim et al. | |
| 2004/0257492 A1 | 12/2004 | Mai et al. | |
| 2005/0007500 A1 | 1/2005 | Lin et al. | |
| 2005/0073518 A1 | 4/2005 | Bontempi | |
| 2005/0162822 A1 | 7/2005 | Shu | |
| 2005/0202879 A1 | 9/2005 | Hussaini et al. | |
| 2005/0231457 A1 | 10/2005 | Yamamoto et al. | |
| 2006/0103299 A1 | 5/2006 | Kwok et al. | |
| 2006/0215421 A1 | 9/2006 | Chang et al. | |
| 2006/0218828 A1 | 10/2006 | Schrimpf et al. | |
| 2006/0238531 A1 | 10/2006 | Wang | |
| 2006/0292931 A1 | 12/2006 | Tokuda | |
| 2007/0267554 A1 | 11/2007 | Tannas, Jr. | |
| 2008/0002350 A1 | 1/2008 | Farrugia | |
| 2008/0018584 A1 | 1/2008 | Park et al. | |
| 2008/0024268 A1 | 1/2008 | Wong et al. | |
| 2008/0055297 A1 | 3/2008 | Park | |
| 2008/0084166 A1 | 4/2008 | Tsai | |
| 2008/0143187 A1 | 6/2008 | Hoekstra et al. | |
| 2008/0304219 A1 | 12/2008 | Chen | |
| 2009/0009997 A1 | 1/2009 | Sanfilippo et al. | |
| 2009/0102744 A1 | 4/2009 | Ram | |
| 2009/0104989 A1 | 4/2009 | Williams et al. | |
| 2009/0310066 A1 | 12/2009 | Schuch et al. | |
| 2010/0007596 A1 * | 1/2010 | Cho | G09G 3/20 345/98 |

FOREIGN PATENT DOCUMENTS

| | | |
|---|---|---|
| JP | 2007087662 A | 4/2007 |
| JP | 2008046435 A | 2/2008 |
| KR | 20000021499 A1 | 4/2000 |
| KR | 20020072633 A | 9/2002 |
| KR | 20030088786 A | 11/2003 |
| KR | 20050023882 A | 3/2005 |
| KR | 1020060030424 | 4/2006 |
| KR | 20070070711 A | 7/2007 |
| KR | 20080000144 A | 1/2008 |
| KR | 20080029114 A | 4/2008 |
| KR | 1020080046335 | 5/2008 |
| KR | WO2008050402 A | 5/2008 |
| WO | WO2009152310 A3 | 12/2009 |
| WO | WO2010059930 A3 | 5/2010 |

* cited by examiner

MODULAR SYSTEM FOR CONTROLLING A LIQUID CRYSTAL DISPLAY

CROSS-REFERENCE TO RELATED APPLICATIONS

This application is a divisional of U.S. application Ser. No. 13/045,272 filed on Mar. 10, 2011, which claims priority to U.S. application Ser. No. 61/312,538 filed on Mar. 10, 2010 and U.S. application Ser. No. 61/379,193 filed on Sep. 1, 2010. U.S. application Ser. No. 13/045,272 is also a continuation of U.S. application Ser. No. 12/684,608 filed on Jan. 8, 2010, which is a non-provisional of U.S. application Ser. No. 61/143,189 filed on Jan. 8, 2009. All aforementioned applications are incorporated by reference as if fully recited herein.

TECHNICAL FIELD

Exemplary embodiments generally relate to subassemblies for controlling LCD displays.

Background of the Art

Electronic displays such as LCDs are being used in a variety of new applications across a number of different platforms. In some applications, base level LCD assemblies may be purchased from a manufacturer and later modified with housings and additional circuitry to perform the user's desired end functions. In most applications, adding new circuitry requires extensive labor and additional connectors and wiring. This labor is not only expensive and time-consuming, but the additional connectors and wiring are prone to failure or malfunction over time. Further, when these components malfunction in the field, removing the display and servicing it can be very expensive and time-consuming.

SUMMARY OF THE EXEMPLARY EMBODIMENTS

Exemplary embodiments utilize a similar base LCD device while permitting a plurality of different video modules to be installed which can provide a number of different features. Power can be shared throughout the various boards so that separate power modules and connections are not required. The video modules may be connected using board edge connectors to the timing and control boards so that they can easily be installed initially and removed/serviced once in the field. The embodiments allow for a base unit to be mass-manufactured while providing a number of specific features to customers that can easily be installed or even upgraded when the customer would like to change their display setups.

An alternative embodiment may provide a power module as well as the video module. Each module may connect with a backplane which can distribute the power and signals throughout the components of the display. Output power as well as output video may be used with some modules so that displays can be 'daisy-chained' together in order to reduce installation costs and time. Some embodiments may include a speaker on one or both of the modules so that sound reproduction may be included as an option.

The foregoing and other features and advantages will be apparent from the following more detailed description of the particular embodiments of the invention, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION OF EXEMPLARY EMBODIMENTS

Figure 1:
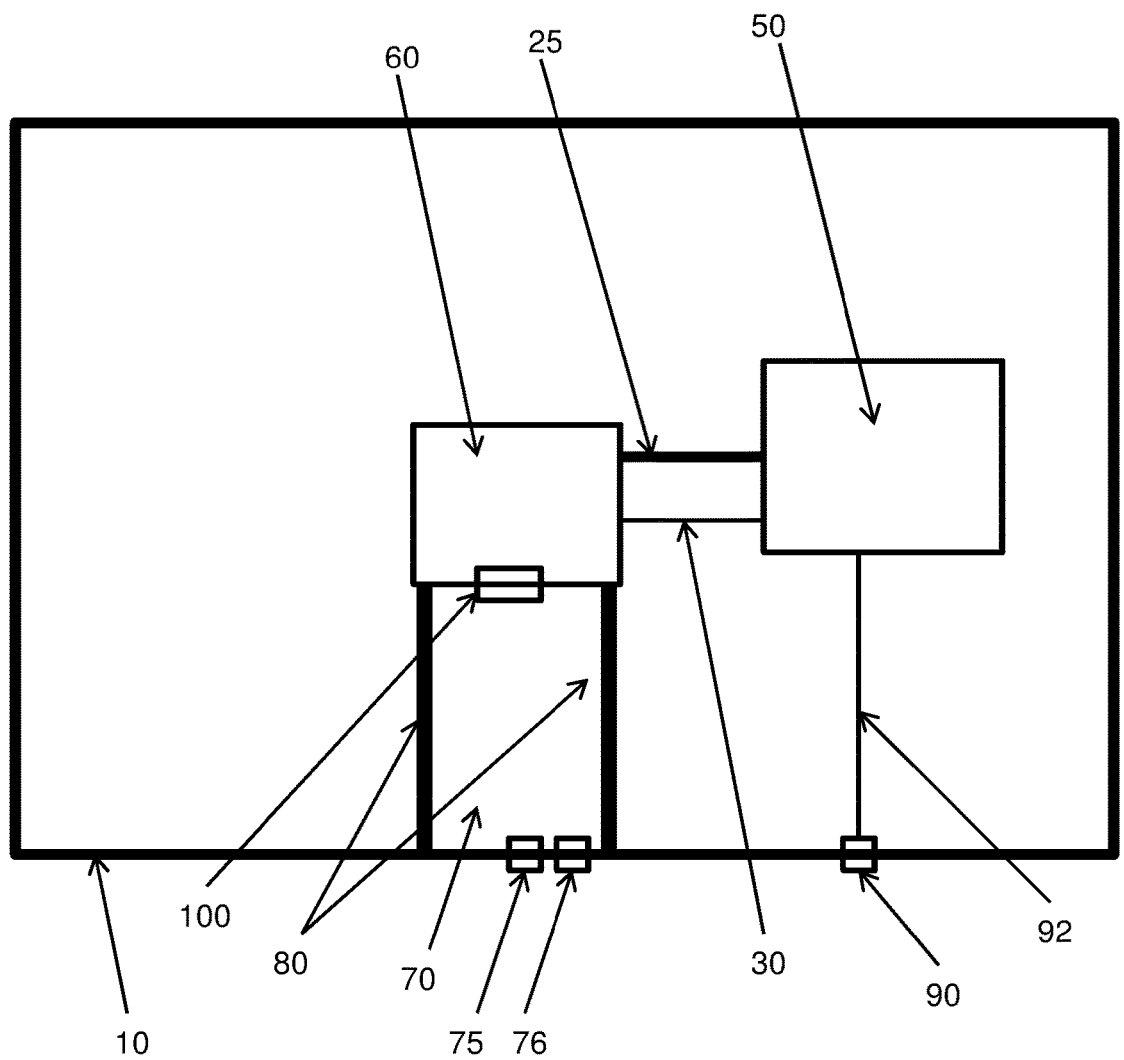
FIG. 1 is a block diagram of an exemplary embodiment using a video player module.

FIG. 1 shows an embodiment of the integrated power supply system, preferably for use with an LED-backlit LCD. For an exemplary embodiment, the LED-backlit LCD along with the LED power and system supply power board (LPB) 50 and the timing and control board (TCON) 60 would be mass-manufactured with similar features. The video module 70 could be designed specifically for each end user and could be easily installed within the mass-manufactured portions of the LCD.

The LPB 50 may provide several power supplies. In some embodiments, the LPB 50 may provide at least two power supplies: a first power supply which takes the inlet AC power from the user's premises and converts this to the low voltage DC required by the electronics (some of this power may be routed to the TCON 60 and video module 70) and a second power supply which drives the LEDs used in the backlight assembly. In other embodiments, there may be an auxiliary power supply (in addition to the first and second) which may send the current required by any other miscellaneous electronics. In some embodiments, the first or second power supply may actually contain more than one physical power brick or supply assembly.

The AC power input 90 may establish communication with the AC power at the location and conduction line 92 may deliver the power to the LPB 50. As taught further below, it may be preferable to also include an AC power outlet such that a second (or third etc.) electronic display can draw power through the first display (so that connecting each display to the local AC power individually is not necessary). Another power conduction line 30 may be used to transfer power from the LPB to the TCON 60. A signal conduction line 25 may be used to transfer various electronic signals back-and-forth between the LPB 50 and the TCON 60.

A video input connection 75 may be provided on the LPB 50 for accepting incoming video data. A video output connection 76 may also be provided on the LPB 50 for allowing a video data output from the display. By using the video output connection 76, several displays may be connected in 'series' or 'daisy-chained' so that overall cabling from the video source can be reduced.

The TCON 60 may convert the differential video signals from the video module 70 into signals required to drive the rows and column circuits of the LCD cell. The TCON 60 may also provide motion compensation and interpolation to convert incoming signals from 60 Hz to 120 Hz, 240 Hz, or greater. The TCON 60 may also analyze the video data in order to dynamically dim the backlight. A board-edge connector 100 may be used to connect the TCON 60 with the video module 70. The connector 100 may allow the TCON 60 to pass power to and receive video data from the video module 60.

A chassis 10 may be used to house the, sometimes mass-manufactured, display components (LCD, TCON, LPB, etc.) and may contain the mechanical features necessary to hold the video module 70 in place. An access opening may be provided in the chassis and sized to allow the video module 70 to pass through the chassis and attach to the TCON 60. An access panel (preferably lockable) can be provided to cover the access opening so that the video module 70 can easily be accessed, even once the display has been placed in the field. Chassis-mounted guides 80 may allow the video module 70 to accurately and repeatably plug into the TCON 60. The guides 80 may be card guides if using a printed-circuit board or other thin substrate or may be drawer guides if using a different type of substrate.

The video module 70 could be produced in a variety of formats with a number of different components and functions to meet the end-user's needs. Every video module 70 should pass video data to the TCON 60. In addition, every video module 70 should have an edge connector 100 (or some form of blind-mate connector) that will connect the locally generated Low Voltage Differential Signaling (LVDS) video signal to the TCON 60 as well as pick up DC power from the LPB 50 (available through the TCON 60). Additionally, a pair of board extractors may allow the user to overcome any insertion or extraction forces presented by the board edge connector 100.

The video modules 70 may vary by the source of the video content and how 'smart' the onboard processor will be. There are a number of means for generating the LVDS for the TCON. Some video modules 70 may contain DVI/HDMI/DisplayPort inputs with basic processing capabilities. Other video modules 70 may contain wired Ethernet video over IP with a large set of processing features (status and setup information may be accessible via a wired Ethernet connection). Still other video modules 70 may contain wireless Ethernet video over IP with a large set of processing features (status and setup information may be accessible via wired or wireless Ethernet connections). Still other video modules 70 may contain high definition analog video via a coax connection (i.e. cable TV) with basic processing features. Still other video modules 70 may contain an embedded video player where the content to the player can be uploaded with a wired Ethernet connection.

It should be noted that the video module 70 can take on many forms. In some embodiments, the module may be a printed circuit boards with the various components mounted to the board and electrical conduction lines built into one or more layers of the board. Alternatively, the module may simply provide a structure (ex. plate or drawer or substrate) for mounting several components, but this structure may not actually comprise a printed circuit board. Thus, components may be mounted or bolted to the structure and the electrical connections may be provided by wires/harnesses and connectors rather than incorporated into a layer of the board. A similar type of board edge connector (or blind connector) can be used at the back of the plate or drawer to establish communication with the TCON 60.

Figure 2:
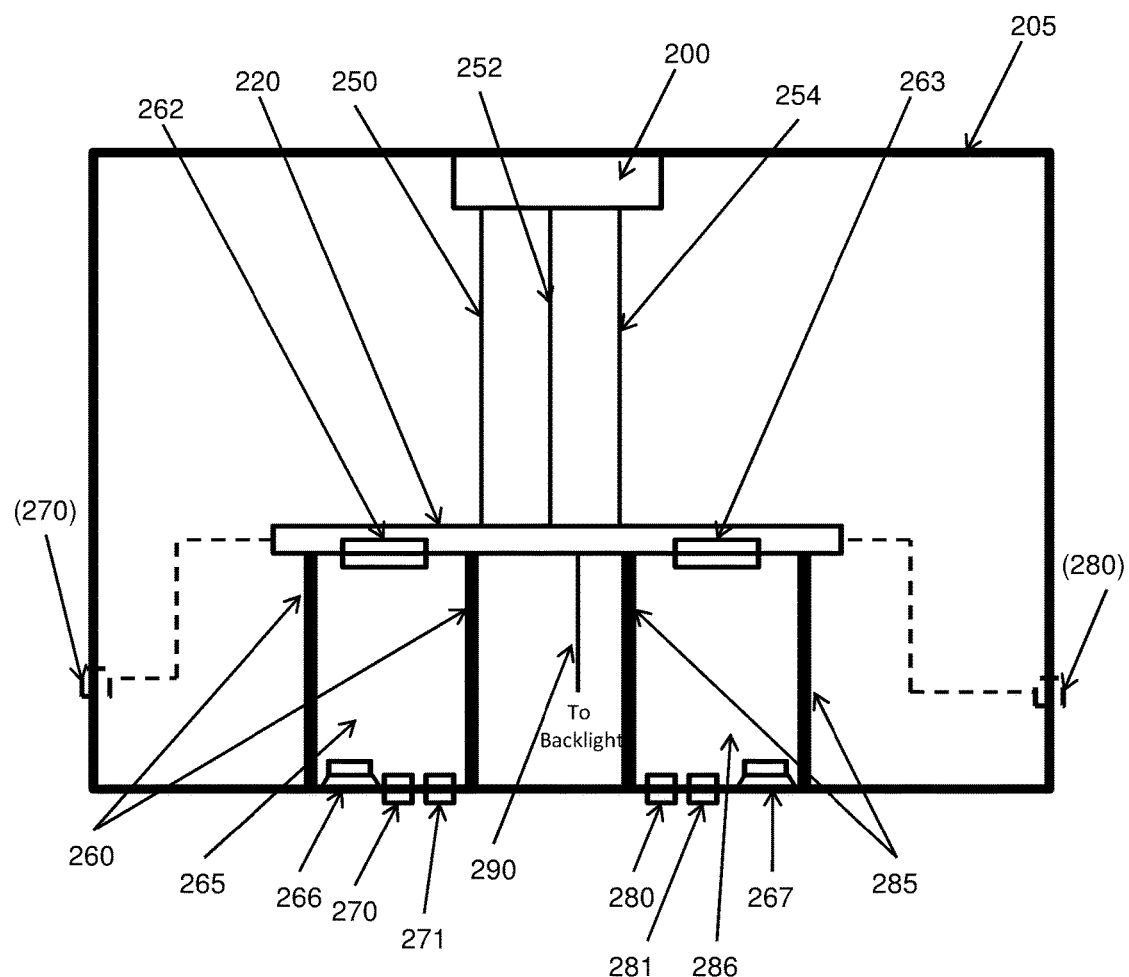
FIG. 2 is a block diagram of another embodiment which uses a video player module as well as a power module.

FIG. 2 shows a block diagram for another embodiment which uses a video module 286 in addition to a power module 265, which connect with a backplane 220 in order to communicate with each other as well as with the TCON 200. The power module 265 may interface with guides 260 so that its connector 262 may line up with that of the backplane 220 when the power module 265 is inserted. Similarly, the video module 286 may interface with guides 285 so that its connector 263 may line up with the backplane 220 when the video module 286 is inserted. The guides 260 and 285 may be fixed to the chassis 205 (or some other portion of the display) which contains the various components and adds structure for securing various assemblies. Access openings may be provided in the chassis 205 and sized to allow the video module 286 or power module 265 to pass through the chassis 205 and attach to the backplane 220.

The power module 265 preferably includes an offline AC power supply which converts AC power from the location to the low voltage DC power typically required by on-board electronics and a DC power supply which provides power to the backlight. Some embodiments may also include an auxiliary power supply which may provide the current for the video module 286 (which is preferably transferred through the backplane 220). An exemplary embodiment contains a power input connection 270 as well as a power output connection 271 on the power module 265. The power output connection 271 allows for multiple displays to be wired in 'series' or 'daisy-chained' so as to reduce the amount of cabling needed. An alternative embodiment would place the power input connection (270) anywhere within the display and simply provide electrical communication with the backplane 220 so that the input power could be routed to the power module 265. The power output connection could also be placed anywhere within the display and simply provide communication with the backplane 220.

The backplane 220 may comprise a printed circuit board with interfacing connectors to the connectors for the power module 265 and video module 286 (as well as the various other electrical communications/connections described herein). The backplane 220 preferably includes conduction lines which allow power from the power module 265 to travel to the TCON 200 (ultimately through power conduction line 250). The backplane 220 may also contain conduction lines which provide power to the video module 286. Preferably, the backplane 220 also provides the power to the backlight through the conduction line 290.

The video module 286 preferably includes a video input connection 280 as well as an optional video output connection 281. Again, the video output connection 281 allows for several displays to be connected in 'series' or 'daisy-chained.' Alternatively, the video input connection (280) could be placed anywhere within the display and simply provide electrical communication with the backplane 220 so that the input video signal could be routed to the video module 286. The video output connection 281 could also be placed anywhere within the display and simply provide electrical communication with the backplane 220.

The connector 263 should preferably provide power from the backplane 220 to the various components of the video module 286. The connector 263 should also allow the video module 286 to output the video signal (preferably Low Voltage Differential Signaling—LVDS) to the backplane 220 and ultimately to the TCON 200 through a video signal conduction line 252. Once the video data is sent through the conduction line 252 to the TCON 200, it may be used to drive the row and column circuits on the LCD. As known in the art, the TCON 200 may also provide various motion compensation and interpolation to convert the incoming signal frequency to the desired frequency for the LCD (i.e. converting 60 Hz to 120 or 240 Hz). In an exemplary embodiment, the TCON 200 would analyze the incoming video data to produce the information necessary to control (i.e. dynamically dim) the backlight. Thus, resulting signals for the backlight may travel through the backlight signal conduction line 254 and connect through the backplane 220 to the power module 265. The signals for the backlight may then be used to direct the DC power supply as to the precise power for the backlight. This precise power information would then preferably be transferred to the backplane 220 where it is sent to the backlight through the conduction line 290.

The video module 286 may also contain an optional speaker 267 and accompanying audio amplifier. Another corresponding speaker 266 may be placed within the power module 265 and receive its signal from the audio amplifier through the power module's 265 connection 262 with the backplane 220. Thus, modules can be designed for end users who desire sound reproduction or prefer no sound production. Later users can also upgrade to sound production even if initially there was none.

Similar to the embodiments described above, the video module 286 may vary widely, depending on the source of the video content and how 'smart' the onboard processor will be. There are a number of means for generating the LVDS for the TCON. Some video modules 286 may contain DVI/HDMI/DisplayPort inputs with basic processing capabilities. Other video modules 286 may contain wired Ethernet video over IP with a large set of processing features (status and setup information may be accessible via a wired Ethernet connection). Still other video modules 286 may contain wireless Ethernet video over IP with a large set of processing features (status and setup information may be accessible via wired or wireless Ethernet connections). Still other video modules 286 may contain high definition analog video via a coax connection (i.e. cable TV) with basic processing features. Still other video modules 286 may contain an embedded video player where the content to the player can be uploaded with a wired Ethernet connection.

It should be noted that the video module 286 and the power module 265 can take on many forms. In some embodiments, the modules may be printed circuit boards with the various components mounted to the board and electrical conduction lines built into one or more layers of the board. Alternatively, the modules may simply provide a structure (ex. plate or drawer) for mounting several components, but this structure may not actually comprise a printed circuit board. Thus, components may be mounted or bolted to the structure and the electrical connections may be provided by wires/harnesses and connectors rather than incorporated into a layer of the board. A similar type of blind connector can be used at the back of the plate or drawer to establish communication with the backplane 220. Using a mounting structure rather than a printed circuit board may allow different types of guides 260 and 285 to be used and may provide a more robust design. Thus, larger or more sensitive components could be mounted directly to the mounting structure and remain secure during install/removal and operation.

An exemplary embodiment may provide a board extractor for the video module 286 or power module 265 or both. An extractor may be used to allow the user to overcome any insertion or extraction force presented by the connectors 262 and 263.

The exemplary embodiments herein permit a unitary design for the LCD/TCON to be mass manufactured while video (and sometimes power) modules can later be designed/installed in a fast and efficient manner depending on the customer's requirements. Once in use, the modules can also be easily replaced/serviced/upgraded while the device remains in the field.

Having shown and described preferred embodiments, those skilled in the art will realize that many variations and modifications may be made to affect the described embodiments and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

What is claimed is:

1. A modular electrical system for controlling a liquid crystal display (LCD) having a backlight and contained within a chassis, the system comprising:
   a backplane having first and second board edge connectors;
   a video module having a board edge connector adapted to connect with the first board edge connector on the backplane, and a video input connection that is physically located on the video module but remotely from the video module board edge connector;
   a power module having a board edge connector adapted to connect with the second board edge connector on the backplane, and an AC power input connection that is physically located on the power module but remotely from the power module board edge connector; and
   a timing and control board (TCON) in electrical communication with the backplane and arranged to receive power through a power conduction line and electrical signals through a signal conduction line, the TCON configured to convert video signals output by the video module into driving signals for the LCD.

2. The control system of claim 1 further comprising:
   an AC power output connection on the power module; and
   a video output connection on the video module.

3. The control system of claim 1 wherein:
   the AC power input connection is in electrical communication with the backplane.

4. The control system of claim 3, further comprising an AC power output connection in electrical communication with the backplane.

5. The control system of claim 1 wherein:
   the video input connection is in electrical communication with the backplane.

6. The control system of claim 5, further comprising a video output connection in electrical communication with the backplane.

7. The control system of claim 5, wherein the video module board edge connector is configured to pass video signals from the video module to the backplane.

8. The control system of claim 7, wherein the video module utilizes low voltage differential signaling (LVDS).

9. The control system of claim 5, wherein the video module board edge connector is configured to pass power from the backplane to the video module.

10. The control system of claim 1, wherein the backplane is configured to route power from the power module to the TCON via the power conduction line.

11. The control system of claim 1, wherein the backplane is configured to supply power to the video module and to route video signals from the video module to the TCON via the signal conduction line.

12. The control system of claim 1, further comprising an electrical conduction line for routing power from the backplane to the backlight.

13. The control system of claim 1 wherein the power module comprises:
   a first power supply that powers the TCON and video module, and
   a second power supply that powers the backlight.

14. The control system of claim 1 further comprising:
a first pair of guides for ensuring proper alignment of the video module board edge connector with the first board edge connector on the backplane; and
a second pair of guides for ensuring proper alignment of the power module board edge connector with the second board edge connector on the backplane;
wherein the guides are fixed to the chassis.

15. The control system of claim 1, further comprising a first speaker on the video module and a second speaker on the power module.

16. A modular electrical system for controlling a backlit liquid crystal display (LCD) contained within a chassis and having a backplane with first and second board edge connectors, the modular system comprising:
a video module having
a video input connection, and
a board edge connector that is physically located remotely from the video input connection and adapted to connect with the first board edge connector on the backplane;
a power module having
a power input connection, and
a board edge connector that is physically located remotely from the power input connection and adapted to connect with the second board edge connector on the backplane; and
a pair of video module guides associated with the chassis and configured to accept the video module and align the video module board edge connector with the first board edge connector on the backplane; and
a pair of power module guides associated with the chassis and configured to accept the power module and align the power module board edge connector with the second board edge connector on the backplane.

17. The modular electrical system of claim 16, further comprising a video output connection on the video module.

18. The modular electrical system of claim 16 further comprising:
a timing and control board (TCON) in electrical communication with the backplane;
a power conduction line configured to route power from the backplane to the TCON; and
a signal conduction line configured to route video signals from the backplane to the TCON.

19. A modular electrical system for controlling a liquid crystal display (LCD) having a backlight and contained within a chassis, the system comprising:
a backplane having a power module board edge connector and a video module board edge connector;
an AC power input connection in electrical communication with the backplane;
a video input connection in electrical communication with the backplane;
a power module having a board edge connector that is physically located remotely from the AC power input connection and adapted to connect with the power module board edge connector on the backplane;
a video module having a board edge connector that is physically located remotely from the video input connection and adapted to connect with the video module board edge connector on the backplane;
guides for aligning the power module and the video module with the power module board edge connector and video module board edge connector on the backplane;
a power conduction line in electrical communication with the backplane;
a signal conduction line in electrical communication with the backplane; and
a timing and control board (TCON) in electrical communication with the backplane through the power conduction line and the signal conduction line, the TCON configured to convert video signals output by the video module into driving signals for the LCD.

20. The control system of claim 19 wherein:
the backplane is configured to route AC power from the AC power input connection to the power module, and power from the power module to other components connected to the backplane;
the video module board edge connector is configured to pass power from the backplane to the video module and to pass video signals from the video module to the backplane;
the power conduction line is configured to pass power from the backplane to the TCON; and
the signal conduction line is configured to pass video signals from the video module to the TCON.

* * * * *